(12) United States Patent
Miura et al.

(10) Patent No.: US 8,349,392 B2
(45) Date of Patent: Jan. 8, 2013

(54) PRINTED MATERIAL AND MANUFACTURING METHOD THEREOF

(75) Inventors: Hiroyuki Miura, Tokyo (JP); Daisuke Koiso, Tokyo (JP)

(73) Assignee: Toppan Printing Co., Ltd. (JP)

( * ) Notice: Subject to any disclaimer, the term of this patent is extended or adjusted under 35 U.S.C. 154(b) by 1222 days.

(21) Appl. No.: 11/869,664

(22) Filed: Oct. 9, 2007

(65) Prior Publication Data
US 2009/0092787 A1    Apr. 9, 2009

(51) Int. Cl.
*B05D 5/06* (2006.01)
*B05D 1/02* (2006.01)

(52) U.S. Cl. .......... 427/58; 427/66; 427/168; 427/421.1

(58) Field of Classification Search ............ 427/66, 427/256, 421.1, 58, 164, 165, 168
See application file for complete search history.

(56) References Cited

U.S. PATENT DOCUMENTS

| | | | | |
|---|---|---|---|---|
| 2004/0018386 A1* | 1/2004 | Naito et al. | | 428/690 |

FOREIGN PATENT DOCUMENTS

| | | | |
|---|---|---|---|
| JP | 06-347637 | * | 12/1994 |
| JP | 07-035915 | | 2/1995 |
| JP | 07-035916 | | 2/1995 |
| JP | 07-248413 | | 9/1995 |
| JP | 08-166507 | | 6/1996 |
| JP | 09-073010 | | 3/1997 |
| JP | 10-123315 | | 5/1998 |
| JP | 10-309455 | | 11/1998 |
| JP | 3328297 B2 | | 9/2002 |
| JP | 2003-344640 | | 3/2003 |
| JP | 2003-243163 | | 8/2003 |
| JP | 2005-352105 | | 12/2005 |
| JP | 2006-084911 | | 3/2006 |
| JP | 2006-163233 | | 6/2006 |
| JP | 2006-243588 | | 9/2006 |
| JP | 2006-251433 | | 9/2006 |
| JP | 2006-267821 | | 10/2006 |
| JP | 2006-276180 | | 10/2006 |
| JP | 2006-284674 | | 10/2006 |
| JP | 2007-025427 | * | 2/2007 |
| JP | 2007-025428 | * | 2/2007 |

OTHER PUBLICATIONS

Notification of Reasons for Refusal from JPO for Appl. No. 2005-209633, mailed Nov. 24, 2010, 4 pgs.
Translation of Notification of Reasons for Refusal from JPO for Appl. No. 2005-209633, mailed Nov. 24, 2010, 5 pgs.
Notification of Reasons for Refusal from JPO for Appl. No. 2005-209634, mailed Nov. 30, 2010, 4 pgs.
Translation of Notification of Reasons for Refusal from JPO for Appl. No. 2005-209634, mailed Nov. 30, 2010, 5 pgs.

* cited by examiner

*Primary Examiner* — James Lin
(74) *Attorney, Agent, or Firm* — Squire Sanders (US) LLP

(57) ABSTRACT

A printed material as an embodiment of the invention comprising; a substrate; partition walls for partitioning the surface of the substrate into a plurality of regions; and an ink film formed by printing method using a printing apparatus in the plurality of regions, in which the partition wall comprises an ink repellent material containing a resin binder and an ink repellent agent, and the ink repellent agent is a compound having a site showing a compatibility with the resin binder and a site having an ink repellency, the critical surface tension of the partition wall is from 24 to 30 mN/m, and the number average molecular weight of the ink repellent agent is from 40,000 to 100,000.

8 Claims, 4 Drawing Sheets

PRINTED MATERIAL AND MANUFACTURING METHOD THEREOF

BACKGROUND OF THE INVENTION

1. Field of the Invention

The present invention concerns a printed material manufactured by using a printing apparatus such as a letterpress printer or an ink jetting apparatus. Such a printed material includes, for example, an organic electroluminescence device, and an organic light emitting layer of the organic EL device is formed by using a printing apparatus such as a letterpress printer. Further, the printed material also includes, for example, a color filter, and a coloring layer thereof is formed by using the printing apparatus. In addition, the printed material also includes, for example, circuit substrates, thin film transistors, micro-lenses, and biochips.

2. Description of the Related Art

For example, various studies have been made on the method of forming an organic light emitting layer of an organic electroluminescence device (hereinafter referred to as an "Organic EL device") and, as typical methods, various printing methods such as a photolithographic system, letterpress printing system, and ink jetting system have been known. In the formation of a pixel pattern of the organic EL device by the photolithographic system, a coating film of photosensitive resin layers for respective colors is formed over the entire substrate, and exposed patternwise, and then unnecessary portion of the coating film is removed to form each of pixels with the remaining pattern. In this method, since most of the coating film is removed by development, a great amount of material is lost. Further, since exposure and developing steps are conducted on every pixel, the number of steps increases. The photolithographic system is utilized for the manufacture not only for the organic EL device but also for various optical devices such as color filters and electric devices.

Then, the problem described above in the photolithographic system has become remarkable along with increase of the size of substrates to result in problems both in view of the cost and the environment. As a method of overcoming the problems, a system of manufacturing an optical device by a printing system has attracted attention. For example, in a case of manufacturing an organic EL device by the printing method, inks containing organic light emitting materials of R, G, B tri-colors are used and respective colors can be printed simultaneously by a step for once. Accordingly, when compared with the photolithography, since the ink material is scarcely lost wastefully and the step of forming three-color pixels can be shortened, decrease of the environmental burden and remarkable reduction of the cost can be expected.

As described above, since the printing system can simplify the manufacturing process and save the cost, the system is applied to the manufacture of optical devices such as organic EL devices or color filters. However, one of the problems in the printing system is "color mixing" and "blanking". Description is to be made to a case of manufacturing the optical devices for letterpress printing as an example.

"Color mixing" means a failure in which inks are mixed to each other between adjacent pixels and coloring inks of different colors are mixed with each other. Coloring mixing is caused by the overflow of printed (jetted) ink exceeding a partition wall. In order to overcome the problem, JP-A No. Hei 5-93808 (Patent Document 1) proposes, for example, a method of manufacturing a color filter by using a printing system. JP-A Nos. Hei 7-248413 and 2003-243163 (Patent Documents 2 and 3) describe that a black resin layer incorporated with an ink repellent agent such as a fluoro-containing compound to form a partition wall in order to prevent ink bleeding and color mixing in the ink printing step.

"Blanking" is a failure mainly attributable to that an ink applied by a printing print or an ink jetting apparatus can not be diffused sufficiently and uniformly in a region surrounded with a partition wall, which causes display failure such as color shading or lowering of the contrast in the color filter, and pin holes causing short circuit in the organic EL device. Blanking occurs in a case where an ink repellent agent exudes from the lateral surface of the partition wall. Exudation of the ink repellent agent from the lateral surface of the partition wall is promoted by heating. Referring to FIG. 1, in a case of forming a partition wall by a photolithographic method, after coating a resin composition 20 as a partition wall to a substrate 10 (FIG. 1A), and exposing and developing the same by using a mask (FIGS. 1B, 1C), the partition wall is heated (post-baked). In this case, an ink repellent agent exudes from a portion of the partition wall as shown in FIG. 1D and an ink 41 applied by the printing apparatus does not spread by wetting to cause blanking (FIG. 1E).

Further, in a case of manufacturing a partition wall by the photolithographic system, by applying a photosensitive composition containing an ink repellent agent on a substrate and exposing and developing the same to form a partition wall, blanking occurs also in a case where the ink repellent agent is present in the opening of the partition wall is not removed sufficiently by a developer and the ink repellent agent remains within the pixel (FIG. 2A to FIG. 2E).

A typical method of manufacturing an optical device by using a letterpress printer is to be described according to the Patent Documents 2 and 3. The Patent Documents 2 and 3 describe a method of using a fluoro-containing material as an ink repellent agent for a partition wall of a color filter or an organic EL device manufactured by a printing system. Further, typical methods of manufacturing optical devices by using an ink jetting apparatus is to be described according to JP-A Nos. Hei 6-347637, 7-35915, 7-35916, 7-35917, and 9-203803 (in columns 0030 to 0035) (Patent Documents 4 to 8). The Patent Documents 4 to 7 describe methods of using fluoro-containing materials as the ink repellent agent for the partition wall of the color filter manufactured by the ink jetting method.

According to the methods described above, while color mixing by the printing could be prevented, since resin molecules of the ink repellent agent contained fluorine atoms entirely, the polarity for the entire resin molecules was high and compatibility with other resin ingredients and the solvent ingredient contained in the ink was low. Therefore, in the step of heat-baking after the exposure and development of the partition wall pattern, the ink repellent agent exuded from the partition wall to the pixel to cause the problem of "blanking". Further, even when the partition wall was formed by using the ink repellent agent, since the ink repellent ingredient was not concentrated to the surface of the partition wall but the ink repellent molecules were dispersed, no sufficient ink repellency could be obtained to sometime result in "color mixing", they cannot be said to sufficiently overcome the problem of "color mixing".

For closely adhering the ink repellent agent to the partition wall thereby preventing exudation into the pixel and keeping a sufficient ink repellency at the same time, it has been proposed a method of using a compound as an ink repellent agent, having a resin compatible alkyl group on one side and an ink repellent perfluoroalkyl group on the opposite side thereby providing the ink repellency only on one side of the molecular chain (Patent Document 8).

However, even by the use of the compound of a structure in which a molecular chain having the resin compatibility and a molecular chain having the ink repellency are connected as the ink repellent agent, the ink repellent agent easily exudes from the lateral surface of the partition wall and the problem of "blanking" could not be solved.

The present invention has been achieved for overcoming the problems described above and intends to provide a printed material of high quality and high reliability by preventing color mixing and blanking upon manufacture of a printed material at a reduced cost by a simple process utilizing a printing system, as well as provide a manufacturing method thereof.

SUMMARY OF THE INVENTION

A preferred embodiment of the present invention is a printed material comprising a substrate, partition walls for partitioning the surface of the substrate into a plurality of regions; and an ink film formed by printing in the plurality of regions by using a printing apparatus, in which the partition wall comprises an ink repellent material containing a resin binder and an ink repellent agent, and the ink repellent agent is a compound having a site showing a compatibility with the resin binder and a site having an ink repellency, the ink repellent material comprises a heated resin composition, the critical surface tension of the resin composition is from 24 to 30 mN/m, and the number average molecular weight of the ink repellent agent is from 40,000 to 100,000.

DESCRIPTION FOR REFERENCES

Figure 1:
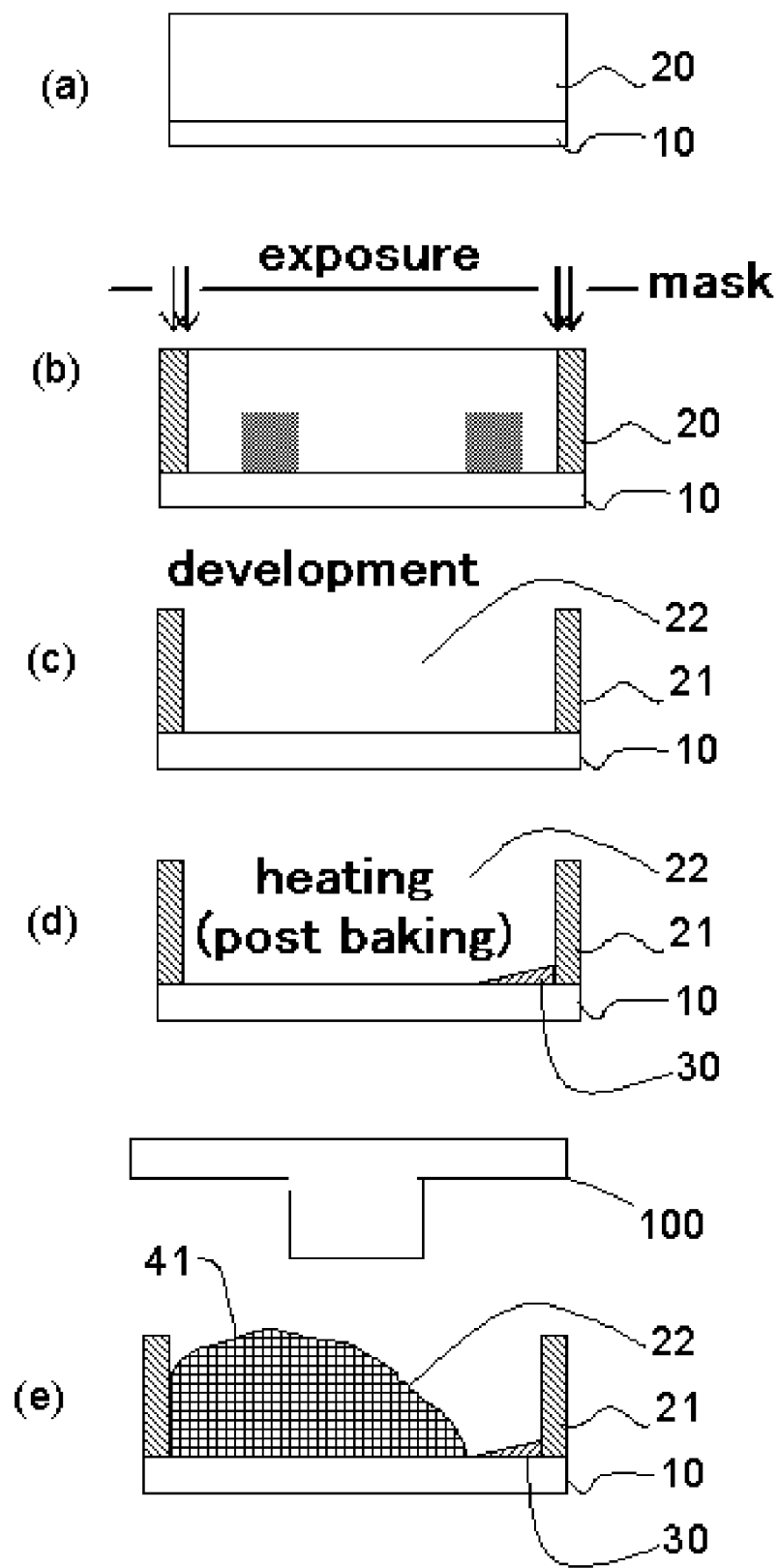
FIGS. 1 (a), (b), (c), (d) and (e) are explanatory views for an example of a printed material in which blanking occurs.
Figure 2:
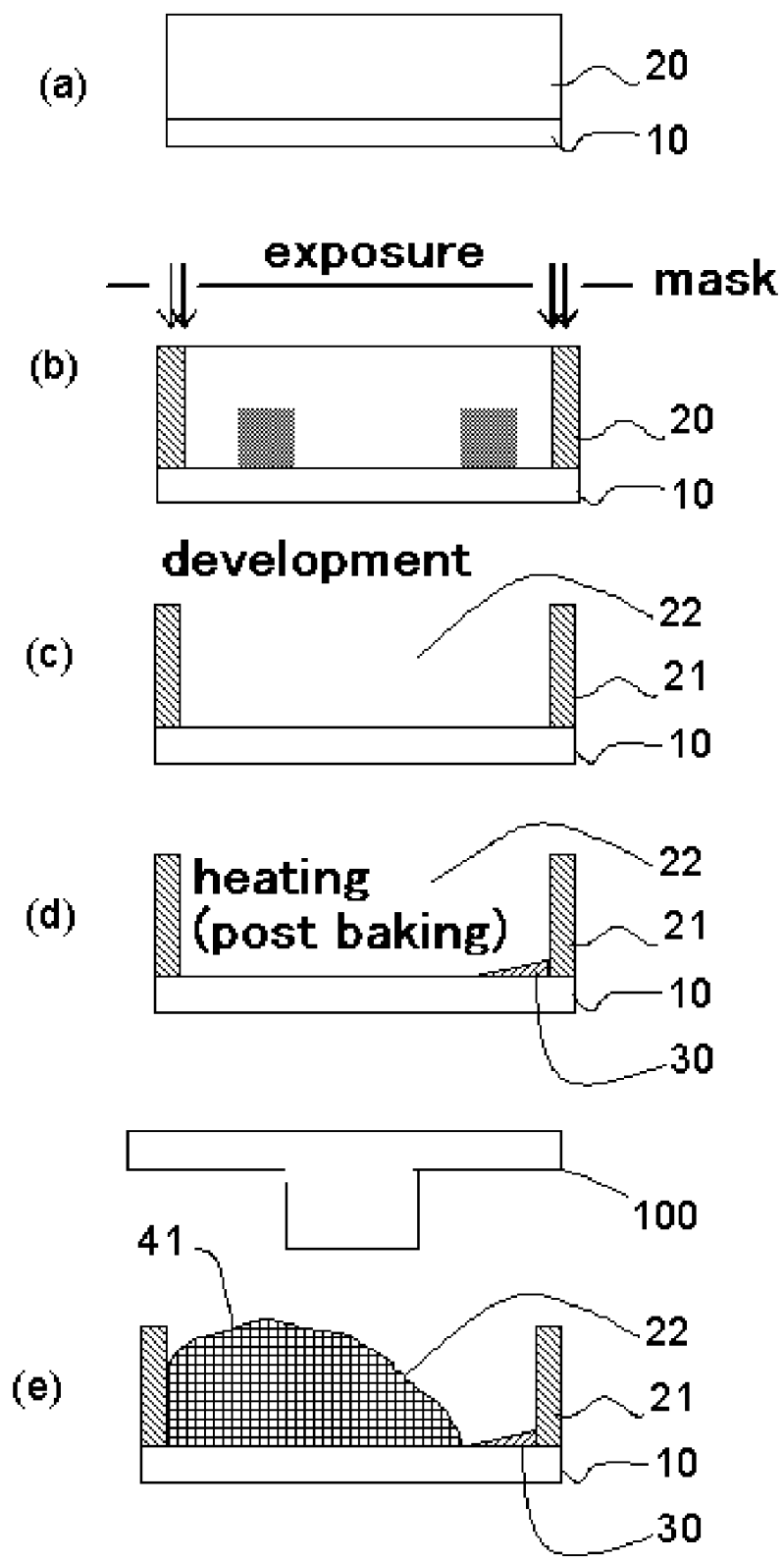
FIGS. 2 (a), (b), (c), (d) and (e) are explanatory views for an example of a printed material in which blanking occurs.

10 . . . substrate
101 . . . substrate
20 . . . resin composition
201 . . . electrode on substrate side
21 . . . partition wall
22 . . . opening of partition wall
23 . . . ink film
24 . . . printed material
30 . . . ink repellent agent
301 . . . partition wall
401 . . . organic light emitting layer
41 . . . ink
100 . . . letterpress type
501 . . . electrode on sealing side

DESCRIPTION OF THE PREFERRED EMBODIMENTS

The present inventors incorporated a resin composition used for forming a partition wall with a compound having two sites, that is, a site showing a compatibility with a resin binder in the resin composition and a site having an ink repellency (hereinafter referred to as an ink repellent compound) as an ink repellent agent and formed partition walls by patterning and heating the resin composition on the substrate. In this case, when the ink repellent agent was polymerized by a re-precipitation method and controlled to the number average molecular weight of 40,000 to 100,000, the critical surface tension of the partition wall after heating was 24 to 30 mN/m.

In the thus prepared partition walls, the ink repellent compound was concentrated to the boundary between the partition wall surface and the outside. Further, in the ink repellent compound, the site showing the compatibility with the resin binder was aligned to the inside of the partition wall, while the site having the ink repellency was to the outside of the partition wall.

Further, it was also found that the ink repellent agent did not exude from the lateral surface of the partition wall.

Then, when the ink was printed by a printing apparatus such as an inkjet apparatus to the substrate having the partition wall, the partition wall showed favorable ink repellency and caused neither color-mixing nor blanking.

Preferred embodiments of the invention are to be described.

The printed material according to the invention can be utilized suitably as an optical part constituting the display screen of a display. In this case, the plurality of regions correspond to the pixels constituting the display screen. Further, a black light shielding material may be mixed to the partition wall to also have a function as a light shielding layer.

The optical part includes, for example, a color filter constituting the display screen of a liquid crystal color display, in which the ink film constitutes a coloring layer for coloring a transmission light, and the coloring layer has a plurality of colors having colors different on every region.

Further, optical part also includes, for example, an organic electroluminescence device. In this case, the ink film constitutes an organic light emitting material layer. Further, this is an organic light emitting material layer of plural colors having colors different on every region.

In addition, the printed material of the invention also includes circuit substrates, thin film transistors, micro-lenses, and biochips.

The substrate of the invention is used as a support substrate of a printed material. Specifically, known materials for transparent substrate can be used, for example, glass substrate, quartz substrate, plastic substrate, and dry films. Among all, the glass substrate is excellent in view of transparency, strength, heat resistance and weather proofness.

The partition wall of the invention has a function of partitioning the surface of the substrate into a plurality of regions and preventing color-mixing of inks printed in each of the plurality of regions respectively. In the invention, color-mixing of the ink is prevented and, at the same time, blanking is prevented by controlling the critical surface tension of the partition wall to 24 to 30 mN/m. In a case where the critical surface tension of the partition wall is less than 24 mN/m, the ink repellent agent exudes from the partition wall to result in the problem of blanking. On the other hand, in a case where it exceeds 30 mN/m, the ink repellency becomes insufficient to result in the problem of color-mixing of the ink. As will be described later, one of means for controlling the critical surface tension of the partition wall includes control for the number average molecular weight of the ink repellent agent.

Further, in a case where the printed material is an optical part constituting the screen of a display, the contrast of the display screen can be improved by providing the partition wall with the light shielding property. In any case, it is necessary to incorporate, the resin binder and the ink repellent agent as the essential ingredient to the resin composition constituting the partition wall.

The resin binder adheres and fixes the partition wall to the substrate and provides the partition wall with an ink resistance. The binder resin is, preferably, a resin containing an amino group, amide group, carboxyl group, or hydroxyl group. The binder includes, specifically, cresol-novolac resin, polyvinyl phenol resin, acrylic resin, and methacrylic resin. The resin binders may be used each alone or two or more of them may be mixed.

Further, the ink repellent agent provides the partition wall with ink repellency to the ink. As the ink repellant agent, a polymer compound having a site showing a compatibility with the resin binder and a site having an ink repellency (ink repellent compound) is used for the resin composition. For example, a block copolymer having a block showing the compatibility with the resin binder and a block having the ink repellency can be used.

The ink repellent agent having such both sites emerges on the surface of the partition wall with lapse of time or by heating. Then, it remains on the surface of the partition wall in a state where the site showing the compatibility with the resin binder is on the inner side and the site having the ink repellency is on the outer side to provide the surface with the optimal critical surface tension described above. Further, the number average molecular weight of the ink repellent compound is controlled to 40,000 to 100,000. For the number average molecular weight of the ink repellent agent, a value showing the data measured by GPC (Gel Permeation Chromatography) as a converted value based on a calibration curve for a standard polystyrene sample is used.

In a case where the number average molecular weight of the ink repellent agent is less than 40,000, the intermolecular force between the ink repellent agent and the resin binder becomes weak to increase the critical tension of the partition wall. As a result, the ink repellent effect can not be provided to result in the problem of the color-mixing. Further, the ink repellent agent leaches from the partition wall to result in the problem of blanking. On the other hand, in a case where the number average molecular weight of the ink repellent agent exceeds 100,000, the intermolecular force between the ink repellent agent and the resin binder increases to lower the critical surface tension of the partition wall.

For the site having the water repellency, a fluoroalkyl group and, more preferably, a perfluoroalkyl group can be used. For the site showing the compatibility with the resin binder, alkyl groups, alkylene groups, or known oleophilic polymers such as polyvinyl alcohols can be used.

In addition, for the ink repellent agent, a fluoro-containing compound or a silicon-containing compound can be used together. Examples of the fluoro-containing compound include, specifically, vinylidene fluoride, vinyl fluoride, trifluoroethylene, or fluoro-resins such as copolymers thereof. Further, the fluoro-containing compounds can be used each alone or two or more of them may be used in combination. The silicon-containing compounds include those having organic silicon in the main chain or on the side chains and include, for example, silicon resins and silicone rubber containing a siloxane ingredient. Further, the silicon-containing compounds can be used each alone or two or more of them may be used in combination. Further, the fluoro-containing compound and the silicon-containing compound, or other ink repellent ingredient may be used in combination.

The content of the ink repellant agent of the invention is, preferably, from 0.01% by weight to 10% by weight based on the resin composition.

Further, the black light shielding material provides the partition wall with the light shielding property and improves the contrast on the display screen. As the black light shielding material, black pigments, black dyes, carbon blacks, aniline black, graphite, iron black, titanium oxide, inorganic pigments, and organic pigments can be used. The black light shielding materials may be used each alone or two or more of them may be mixed.

Further, the resin composition can be used by being diluted optionally with an appropriate solvent. Examples of the solvent usable herein include, specifically, dichloromethane, dichloroethane, chloroform, acetone, cyclohexanone, ethylacetate, 2-methoxyethanol, 2-ethoxyethanol, 2-buthoxyethanol, 2-ethylethoxyacetate, 2-butoxyethylacetate, 2-methoxyethyl ether, 2-ethoxyethyl ether, 2-(2-ethoxyethoxy)ethanol, 2-(2-butoxyethoxy)ethanol, 2-(2' ethoxyethoxy)ethylacetate, 2-(2-buthoxyethoxy)ethyl acetate, propyleneglycol monomethyl ether, propylene glycol monomethyl ether acetate, diethylene glycol dimethyl ether, and tetrahydrofuran. The solvent is used in such an amount that it can provide coating which is homogeneous upon printing or coating on the substrate and a coating film with no coating unevenness. For the content of the solvent, it is preferred that the amount of the solvent is from 50 to 97% by weight based on the entire weight of the resin composition.

In addition, additives having compatibility, for example, leveling agent, chain transfer agent, stabilizer, sanitizing dye, surfactant, coupling agent, etc. can be added optionally to the resin composition.

Then, the partition wall can be formed by using the resin composition, for example, by a printing method, photolithographic method, or transfer method. In a case of forming the partition wall by photolithography, a photosensitive resin composition formed by providing the resin composition with photosensitivity is used. Further, in a case of forming the partition wall by the printing method, a resin composition such as a heat setting resin composition can be used.

<Formation of Partition Wall by Letterpress Printing Method>

At first, description is to be made to a case of forming the partition wall by a letterpress printing method. A resin composition (hereinafter referred to as a printing material) is printed on a substrate by using a letterpress printer. The printing material comprises a resin binder and an ink repellent agent as the essential ingredient and further contains a cross linker and a solvent. Further, a black shielding material and the additives may also be added. The critical surface tension of the printing material is preferably from 30 to 40 mN/m. In a case where it is less than 30 mN/m, the printed resin composition is liable to undergo the effect of unevenness on the surface of the substrate and, on the other hand, in a case where it exceeds 40 mN/m, the printability is worsened. Successively, the printed material is heated at 100° C. to 250° C. within a range from 3 to 60 min.

For optimizing the critical surface tension of the partition wall, the critical surface tension of the printing material after being heated under a specific heating condition is within a range from 24 to 30 mN/m. In a case where it exceeds 30 mN/m, the ink repellency is insufficient to cause a problem of blanking when an ink film is applied subsequently by a printer. On the other hand, in a case where it is less than 24 mN/m, since the ink repellent agent is excessively concentrated to the surface of the partition wall, the ink repellent agent exude from the lateral surface of the partition wall to cause the problem of blanking. The specific heating conditions are those in which the temperature of a hot plate, hot blow furnace, far infrared furnace, or the like is set to about 200° C. and heating is applied for about 10 min.

(Formation of Partition Wall by Photolithographic Method)

Description is to be made to a case of forming a partition wall by a photolithographic method. A resin composition (hereinafter referred to as a photosensitive resin composition) is coated on a substrate by using a spin coater, slit coater, or the like. The photosensitive resin composition is generally classified into a positive type and a negative type and the negative type photosensitive resin composition contains a resin binder, a monomer, a photopolymerization initiator, and the ink repellent agent. The positive type photosensitive resin composition contains a positive type photosensitive resin and the ink repellent agent. A crosslinker, a black shielding material, a pigment, and an additive may be added optionally further to the photosensitive resin compositions. The critical surface tension of the photosensitive resin composition is, preferably, from 30 to 40 mN/m. In a case where it is less than 30 mN/m, the coated resin composition undergoes the effect of unevenness on the surface of the substrate. In a case where it exceeds 40 mN/m, the coatability of the resin composition is worsened.

Successively, the substrate coated at one surface with the photosensitive resin composition is exposed by using a mask for the pattern of the partition walls. The substrate is developed with a developer and unnecessary photosensitive resin composition is removed to form a partition wall on the substrate. In a case where the critical surface tension of the coated resin composition is from 30 to 40 mN/m or less, since the ink repellent agent is concentrated appropriately to the surface during development, development proceeds more in the lower portion compared with the upper portion of the resin composition. As a result, since the partition wall is in an inversed taper shape, this provides an effect that the shape of the ink film formed by printing using the printer is made planar. Subsequently, the partition wall is heated to about 100° C. to 250° C. for 3 min to 60 min.

For optimizing the critical surface tension of the partition wall, it is preferred to control the critical surface tension after heating the photosensitive resin composition under a specified heating condition within a range from 24 to 30 mN/m. In a case where it exceeds 30 mN/m, the ink repellency of the photosensitive resin composition is insufficient to result in a problem of color mixing when printing an optical material by a printer subsequently. On other hand, in a case where it is less than 24 mN/m, since the ink repellent agent is excessively concentrated to the surface of the photosensitive resin composition (partition wall) the ink repellent agent exudes from the lateral surface of the photosensitive resin composition (partition wall) to result in a problem of blanking. The specified heating conditions are those where the temperature for the hot plate, hot blow furnace, far infrared rays furnace or the like is set to about 200° C. and heating is conducted for 10 min like in the case described above.

(Formation of Ink Film by a Printer)

A partition wall having ink repellency is formed on a substrate by the method described above, and an ink is applied or jetted to the opening of the partition wall by using a printer to form an ink film.

For the printing system and the printing method, known printing method such as letterpress printing, screen printing, gravure printing, reversal printing, and ink jet printing can be used. For example, in the manufacture of an organic electroluminescence device, a letterpress printing method using a flexographic type is particularly preferred. After forming the ink film, heating can be applied optionally to dry and cure the solvent for the ink. Further, in the manufacture of a color filter, an ink jet printing method is particularly preferred. While the ink jet printer includes a piezo-conversion system and a thermo-conversion system depending on the difference of the jetting method, the piezo-conversion system is particularly preferred. It is preferred to use a printer at an ink particle frequency about from 5 to 100 KHz having a nozzle diameter of from about 5 to 80 μm, in which a plurality of heads are arranged and a plurality of nozzles are incorporated into one single head. In addition, for the ink jetting apparatus, those known so far can be used. After forming the ink film, heating is conducted optionally to dry and cure the solvent for the ink.

(Photosensitive Resin Composition)

As the monomer applied to the photosensitive resin composition, monomers or oligomers having vinyl group or aryl group, and molecules having vinyl group or allyl group at the terminal ends or on the side chains can be used. The monomer include, specifically, (meth) acrylic acid and salt thereof, (meth) acrylic acid esters, (meth)acrylamide, maleic acid anhydride, maleic acid ester, itaconic acid ester, styrenes, vinyl ethers, vinyl esters, N-vinyl heterocyclic rings, allyl ethers, allyl ethers, and derivatives thereof. Preferred compounds included, for example, polyfunctional acrylates of relatively low molecular weight such as pentaerythritol triacrylate, trimethylol propane triacrylate, pentaerythritol tetraacrylate, ditrimethylol propane tetraacrylate, dipentaerythritol penta- and hexa-acrylate. The monomers can be used each alone or two or more of them may be used in admixture. The amount of the monomer based on 100 parts by weight of the binder resin can be within a range from 1 to 200 parts weight, preferably, from 50 to 150 parts by weight.

Further, examples of the photopolymerization initiator include banzophenone compounds such as benzophenone, 4,4'-bis(dimethylamino)benzophenone, and 4,4'-bis(diethylamino)benzophenone. Further, as the photopolymerization initiator, acetophenone derivatives such as 1-hydroxycyclohexyl acetophenone, 2,2-dimethoxy-2-phenyl acetophenone, and 2-methyl-1-[4-(methylthio)phenyl]-2-morpholino propane-1-one can be used. Further, thioxanthone derivatives such as thioxanthone, 2,4-diethylthioxanethone, 2-isopropyl thioxanthone, 2-chlorothioxanethone may also be used. Further, they may be also anthraquinone derivatives such as 2-methylanthraquinone, 2-ethylanthraquinone, 2-t-butylanthraquinone, and chloroanthraquinone. Further, benzoin derivatives such as benzoin methyl ether, benzoin ethyl ether, and benzoin phenyl ether can also be used. Further, acyl phosphine derivatives such as phenyl bis-(2,4,6-trimethylbenzoyl)-phosphine oxide, lophine dimer, such as 2-(o-chlorophenyl)-4,5-bis(4'-methylphenyl)imidazolyl dimer, N-aryl glycines such as N-phenylglycine, organic azides such as 4,4'-diazidocalchone, 3,3',4,4'-tetra(tert-butylperoxycarboxy)benzophenone, and quinone diazido group-containing compounds may also be used. The photopolymerization initiators may be used each alone or two or more of them may be mixed. The amount of the photopolymerization initiator based on 100 parts by weight of the binder resin can be within a range from 0.1 to 50 parts by weight and, preferably, from 1 to 20 parts by weight.

Figure 3:
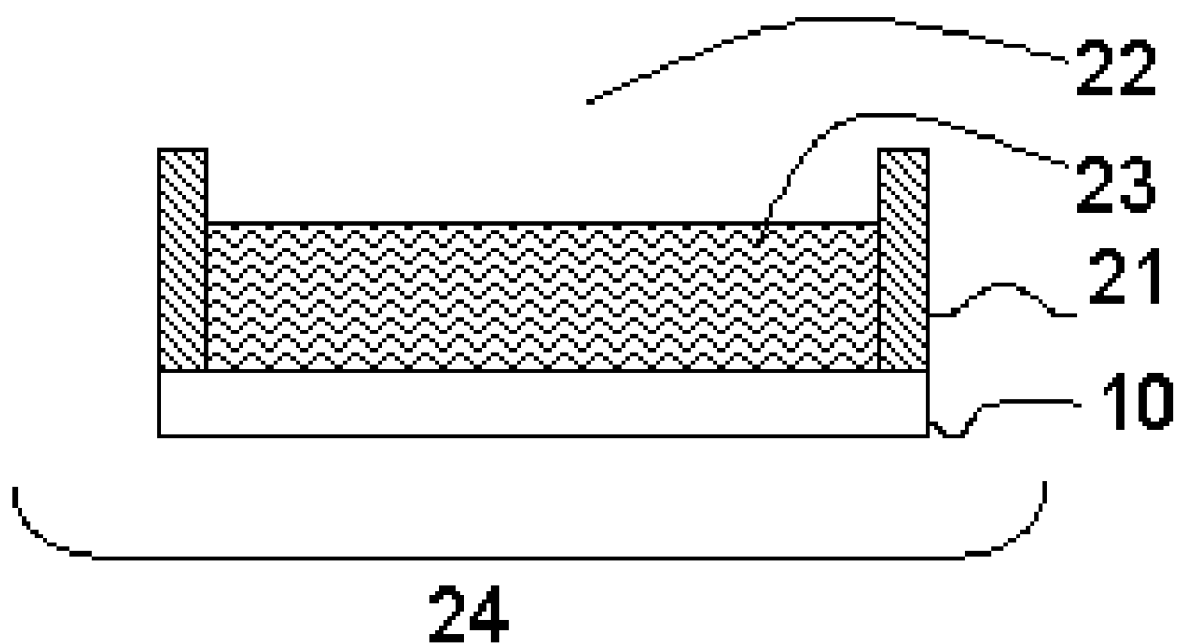
FIG. 3 is a cross sectional view of a printed material according to the invention.

According to the invention, the ink repellent agent can be concentrated to the boundary of the partition wall upon forming the partition wall to improve the ink repellency. Further, exudation of the ink repellent agent from the lateral surface of the partition wall can also be prevented. This can produce a printed material with no occurrence of color mixing or blanking at a good yield by a simple process by the printing system (refer to FIG. 3).

EXAMPLE

A production example in a case where the printed material of the invention is an organic EL device is to be described specifically (Examples 1 to 10 and Comparative Examples 1 to 4). The number average molecular weight (Mn) described in the example was measured according to the GPC method by a Shodex column of Showa Denko KK, and represented by a conversion value based on the calibration curve of a polystyrene standard sample.

(Purification of Ink Repellent Agent)
(Purification of Ink Repellent Agent B)

An ink repellent agent B was obtained by using diethyl ether:hexane=1:1 solution as a precipitation agent to an ink repellent agent "Modiper F2020" (manufactured by NOF Corp.) (hereinafter referred to as ink repellent agent A in this example) and conducting re-precipitation method for three times. The average molecular weight (Mn) of the ink repellent agent A before purification was 35,000. The average molecular weight (Mn) of the ink repellent agent B after purification was 40,000.

(Purification of Ink Repellent Agent C)

An ink repellent agent C was obtained by using diethyl ether:hexane=3:1 solution as a precipitation agent to an ink repellent agent "Modiper F2020" (manufactured by NOF Corp.) and conducting a re-precipitation method for three times. The average molecular weight (Mn) of the ink repellent agent A before purification was 35,000. The average molecular weight (Mn) of the ink repellent agent C after purification was 43,000.

(Purification of Ink Repellent Agent D)

An ink repellent agent D was obtained by using diethyl ether as a precipitation agent to an ink repellent agent "Modiper F2020" (manufactured by NOF Corp.) and conducting the re-precipitation method for three times. The average molecular weight (Mn) of the ink repellent agent A before purification was 35,000. The average molecular weight (Mn) of the ink repellent agent D after purification was 50,000.

(Purification of Ink Repellent Agent E)

An ink repellent agent E was obtained by using p-xylene:diethyl ether=1:1 solution as a precipitation agent to an ink repellent agent "Modiper F2020" (manufactured by NOF Corp.) and conducting re-precipitation method for three times. The average molecular weight (Mn) of the ink repellent agent A before purification was 35,000. The average molecular weight (Mn) of the ink repellent agent E after purification was 58,000.

(Purification of Ink Repellent Agent F)

An ink repellent agent F was obtained by using a p-xylene solution as a precipitation agent to an ink repellent agent "Modiper F2020" (manufactured by NOF Corp.) and conducting the re-precipitation method for three times. The average molecular weight (Mn) of the ink repellent agent A before purification was 35,000. The average molecular weight (Mn) of the ink repellent agent F after purification was 70,000.

(Purification of Ink Repellent Agent G)

An ink repellent agent G was obtained by using a hexane solution as a precipitation agent to an ink repellent agent "Modiper F2020" (manufactured by NOF Corp.) and conducting the re-precipitation method for three times. The average molecular weight (Mn) of the ink repellent agent A before purification was 35,000. The average molecular weight (Mn) of the ink repellent agent G after purification was 37,000.

Example 1

| (Formulation of photosensitive resin composition for forming partition wall) | |
|---|---|
| Binder resin; V 259 (manufactured by Nippon Steel Chemical Co. Ltd.) | 100 g |
| Compound having unsaturated double bond; pentaerythritol tetraacrylate | 1.65 g |
| Photopolymerization initiator; oxime type photopolymerization initiator (CGI-124, manufactured by Ciba Specialty Chemical, Inc.) | 4.95 g |
| Dispersant; commercial solution in which black pigment is dispersed together with a dispersant in a solvent (manufactured by Mikuni Color Co.) EX-2906 | 159 g |
| Solvent; propylene glycol monoethyl ether acetate | 201 g |
| Leveling agent; BYK-330 (manufactured by BYK-Chemie Co.) | 0.003 g |

Each of the ingredients was mixed by the ratio described above to obtain a photosensitive resin composition. Further, the ink repellent agent B was added at a ratio of 0.1 wt % to the photosensitive resin composition based on the entire solid weight (entire weight of the photosensitive resin composition excluding the solution weight of the solvent and the dispersant), and they were stirred to prepare a photosensitive resin composition used for forming the partition wall.

(Formation of Anode)

Figure 4:
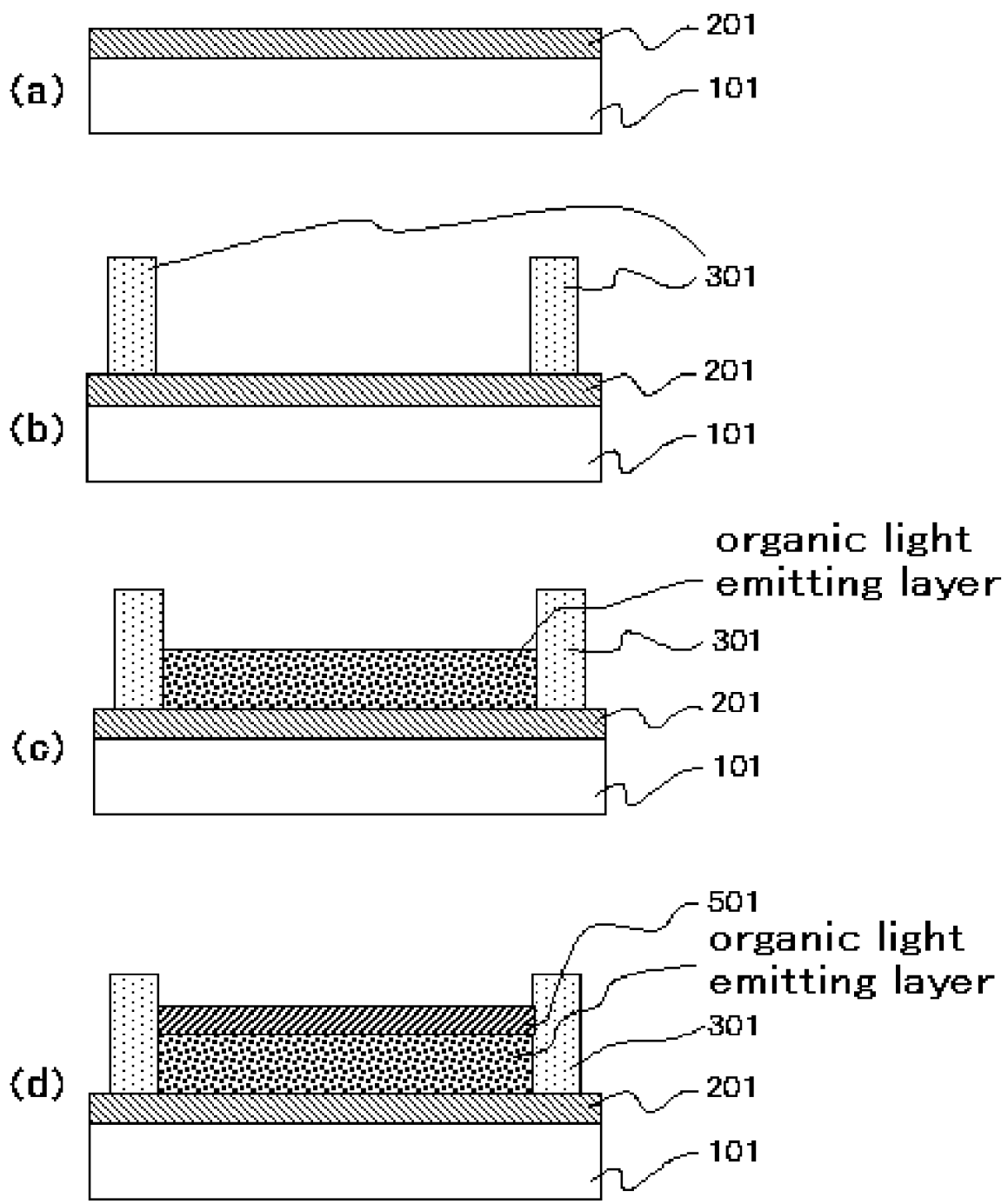
FIGS. 4 (a), (b), (c) and (d) show an example of an organic EL device prepared as a printed material of the invention.

Non-alkali glass ("#1737", manufactured by Corning Inc.) was used as a substrate 101. After forming an ITO film to a thickness of 150 nm by a sputtering method on the substrate 101, the ITO film was patterned by a photolithographic method and a wet etching method to form an electrode layer 201 on the side of the substrate (FIG. 4A).

(Preparation of Partition Wall)

The photosensitive resin composition was coated on the substrate 101 over the entire surface as a thin film shape of 5.0 μm thickness and then pre-baked. Then, exposure was conducted by a super high pressure mercury lamp at 50 mJ/cm$^2$ by using a photomask having a lattice-like pattern. A developing treatment was conducted for 30 sec by an aqueous 10% solution of sodium carbonate to form a partition wall 301 of the resin composition (FIG. 4B). The result of measuring the critical surface tension of the resin composition is shown in Table 1. The critical surface tension obtained as a result of heating the resin at 200° C./10 min in an oven is shown in Table 1. Measurement for the critical surface tension was conducted by measuring the contact angle upon dropping three solutions of different surface tensions and conducting Zisman plot.

The substrate was placed in an oven and put to thermosetting treatment at 180° C. for 10 min. The result of measuring the critical surface tension and the contact angle to the coloring ink (surface tension 30 mN/m) of the partition wall prepared as described above is shown in Table 1.

(Formation of PEDOT Layer)

An aqueous solution of 3,4-polyethylene dioxythiophene (PEDOT) was coated on the substrate by a spin coating method to form a positive hole transport material layer (not illustrated).

(Formation of Organic Light Emitting Layer)

A toluene solution of 1.0% by weight of polyarylene vinylene containing polyarylene vinylene as an organic light emitting material was prepared as a printing ink. The printing ink was printed to the openings of the partition walls disposed on the substrate by using a flexographic proof press equipped with a stripe-like resin letterpress type having 120 μm convex portion and 380 μm concave portion (manufactured by Matsuo Sangyo Co. Ltd.) to form an organic light emitting layer (FIG. 4C). Table 1 shows the absence or presence for the occurrence of color-mixing and blanking in the flexographic printing step of Example 1.

Other organic light emitting materials include, for example, organic light emitting materials soluble to organic solvents such as coumarin type, perylene type, pyrane type, anthrone type, polphyrin type, quinacrydone type, N,N-dialkyl substituted quinacrydone type, naphthalimide type, N,N'-diaryl substituted pyrrolopyrrole type, and iridium complex type, dispersion of such organic light emitting materials in polymers such as polystyrene, polymethyl methacrylate, and polyvinyl carbazole, and polymeric organic light emitting materials such as polyarylene type, polyarylene vinylene type, and polyfluolene type.

(Formation of Organic EL Device)

Then, a Ca film was formed to 5 nm thickness as an electron injection layer of a sealing side electrode layer 501 on an organic light emitting medium layer. Then, an ITO film was formed to 100 nm thickness as a transparent electrode layer on the organic light emitting medium layer formed of the Ca film by a sputtering method. Finally, sealing was conducted by using a UV-curable resin to form an organic EL device.

Example 2

Formulation of Photosensitive Resin Composition for Forming Partition Wall

An organic EL device was manufactured in the same method as in Example 1 except for using an ink repellent agent C instead of the ink repellent agent B by forming partition walls on a substrate and further forming by printing a coloring layer by a printer. In the same manner as in Example 1, the critical surface tension and, the contact angle to the coloring ink (30 mN/m) of the partition wall and the presence or absence of color-mixing and blanking are shown in Table 1.

Example 3

Formulation of Photosensitive Resin Composition for Forming Partition Wall

An organic EL device was manufactured in the same method as in Example 1 except for using an ink repellent agent D instead of the ink repellent agent B by forming partition walls on a substrate and further forming by printing a coloring layer by a printer. In the same manner as in Example 1, the critical surface tension and the contact angle to the coloring ink (30 mN/m) of the partition wall and the presence or absence of color-mixing and blanking are shown in Table 1.

Example 4

Formulation of Photosensitive Resin Composition for Forming Partition Wall

An organic EL device was manufactured in the same method as in Example 1 except for using an ink repellent agent E instead of the ink repellent agent B by forming partition walls on a substrate and further forming by printing a coloring layer by a printer. In the same manner as in Example 1, the critical surface tension and the contact angle to the coloring ink (30 mN/m) of the partition wall and the presence or absence of color-mixing and blanking are shown in Table 1.

Example 5

Formulation of Photosensitive Resin Composition for Forming Partition Wall

An organic EL device was manufactured in the same method as in Example 1 except for using an ink repellent agent F instead of the ink repellent agent B by forming partition walls on a substrate and further forming by printing a coloring layer by a printer. In the same manner as in Example 1, the critical surface tension and the contact angle to the coloring ink (30 mN/m) of the partition wall and the presence or absence of color-mixing and blanking are shown in Table 1.

Comparative Example 1

Formulation of Photosensitive Resin Composition for Forming Partition Wall

An organic EL device was manufactured in the same method as in Example 1 except for using an ink repellent agent A instead of the ink repellent agent B by forming partition walls on a substrate and further forming by printing a coloring layer by a printer. In the same manner as in Example 1, the critical surface tension and the contact angle to the coloring ink (30 mN/m) of the partition wall and the presence or absence of color-mixing and blanking are shown in Table 1.

Comparative Example 2

Formulation of Photosensitive Resin Composition for Forming Partition Wall

An organic EL device was manufactured in the same method as in Example 1 except for using an ink repellent agent G instead of the ink repellent agent B by forming partition walls on a substrate and further forming by printing a coloring layer by a printer. In the same manner as in Example 1, the critical surface tension, the contact angle to the coloring ink (30 mN/m) of the partition wall and the presence or absence of color-mixing and blanking are shown in Table 1.

Example 6

An organic EL device was manufactured in the same method as in Example 1 except for adding the ink repellent agent B at a ratio of 0.20 wt % instead of adding the ink repellent B at a ratio of 0.1 wt % to the entire solid weight (entire weight excluding the solution weight of the solvent and the dispersant) by forming a partition walls on a substrate, further, forming coloring layer by a printer. In the same manner as in Example 1, the critical surface tension and the contact angle to the coloring ink (30 mN/m), and the absence or presence of color-mixing and blanking are shown in Table 2.

Example 7

An organic EL device was manufactured in the same method as in Example 1 except for adding the ink repellent agent C at a ratio of 0.20 wt % instead of adding the ink repellent B at a ratio of 0.1 wt % to the entire solid weight (entire weight excluding the solution weight of the solvent and the dispersant) by forming a partition wall on a substrate, further, forming a coloring layer by a printer. In the same manner as in Example 1, the critical surface tension and the contact angle to the coloring ink (30 mN/m), and the absence or presence of color-mixing and blanking are shown in Table 2.

Example 8

An organic EL device was manufactured in the same method as in Example 1 except for adding the ink repellent agent D at a ratio of 0.20 wt % instead of adding the ink repellent B at a ratio of 0.1 wt % to the entire solid weight (entire weight excluding the solution weight of the solvent and the dispersant) by forming a partition wall on a substrate, further, forming a coloring layer by a printer. In the same manner as in Example 1, the critical surface tension and the contact angle to the coloring ink (30 mN/m), and the absence or presence of color-mixing and blanking are shown in Table 2.

Example 9

An organic EL device was manufactured in the same method as in Example 1 except for adding the ink repellent agent E at a ratio of 0.20 wt % instead of adding the ink repellent B at a ratio of 0.1 wt % to the entire solid weight (entire weight excluding the solution weight of the solvent and the dispersant) by forming a partition wall on a substrate, further, forming a coloring layer by a printer. In the same manner as in Example 1, the critical surface tension and the contact angle to the coloring ink (30 mN/m), and the absence or presence of color-mixing and blanking are shown in Table 2.

Example 10

An organic EL device was manufactured in the same method as in Example 1 except for adding the ink repellent agent F at a ratio of 0.20 wt % instead of adding the ink repellent B at a ratio of 0.1 wt % to the entire solid weight (entire weight excluding the solution weight of the solvent and the dispersant) by forming a partition wall on a substrate, further, forming a coloring layer by a printer. In the same manner as in Example 1, the critical surface tension, the contact angle to the coloring ink (30 mN/m), and the absence or presence of color-mixing and blanking are shown in Table 2.

Comparative Example 3

An organic EL device was manufactured in the same method as in Example 1 except for adding the ink repellent agent A at a ratio of 0.20 wt % instead of adding the ink repellent B at a ratio of 0.1 wt % to the entire solid weight (entire weight excluding the solution weight of the solvent and the dispersant) by forming a partition wall on a substrate, further, forming a coloring layer by a printer. In the same manner as in Example 1, the critical surface tension and the contact angle to the coloring ink (30 mN/m), and the absence or presence of color-mixing and blanking are shown in Table 2.

Comparative Example 4

An organic EL device was manufactured in the same method as in Example 1 except for adding the ink repellent agent G at a ratio of 0.20 wt % instead of adding the ink repellent B at a ratio of 0.1 wt % to the entire solid weight (entire weight excluding the solution weight of the solvent and the dispersant) by forming a partition wall on a substrate, further, forming a coloring layer by a printer. In the same manner as in Example 1, the critical surface tension and the contact angle to the coloring ink (30 mN/m), and the absence or presence of color-mixing and blanking are shown in Table 2.

TABLE 1

| | Ink repellent agent | Ink repellent agent Mn | Critical surface tension | Contact angle | Color mixing occurred | Blanking occurred |
|---|---|---|---|---|---|---|
| Comp. Example 1 | Ink repellent agent A | 35000 | 33.4 mN/m | 30° | X | ○ |
| Comp. Example 2 | Ink repellent agent G | 37000 | 31.5 mN/m | 36° | Δ | ○ |
| Example 1 | Ink repellent agent B | 40000 | 29.7 mN/m | 40° | ○ | ○ |
| Example 2 | Ink repellent agent C | 43000 | 29.2 mN/m | 42° | ○ | ○ |
| Example 3 | Ink repellent agent D | 50000 | 28.6 mN/m | 43° | ○ | ○ |
| Example 4 | Ink repellent agent E | 58000 | 28.3 mN/m | 44° | ○ | ○ |
| Example 5 | Ink repellent agent F | 70000 | 28.1 mN/m | 45° | ○ | ○ |

Addition amount of ink repellent agent (0.10 wt %)

TABLE 2

Addition amount of ink repellent agent (0.20 wt %)

| | Ink repellent agent | Ink repellent agent Mn | Critical surface tension | Contact angle | Color mixing occurred | Blanking occurred |
|---|---|---|---|---|---|---|
| Comp. Example 3 | Ink repellent agent A | 35000 | 31.2 mN/m | 37° | Δ | ○ |
| Comp. Example 4 | Ink repellent agent G | 37000 | 30.1 mN/m | 33° | Δ | ○ |
| Example 6 | Ink repellent agent B | 40000 | 28.9 mN/m | 43° | ○ | ○ |
| Example 7 | Ink repellent agent C | 43000 | 28.3 mN/m | 44° | ○ | ○ |
| Example 8 | Ink repellent agent D | 50000 | 27.7 mN/m | 46° | ○ | ○ |
| Example 9 | Ink repellent agent E | 58000 | 27.3 mN/m | 47° | ○ | ○ |
| Example 10 | Ink repellent agent F | 70000 | 26.9 mN/m | 48° | ○ | ○ |

Examples in a case where the printing material of the invention is a color filter are to be described specifically (Examples 11 to 20 and Comparative Examples 5 to 8).

Example 11

| (Formulation of photosensitive resin composition for black matrix) | |
|---|---|
| Binder resin; V 259 (manufactured by Nippon Steel Chemical Co. Ltd.) | 100 g |
| Compound having unsaturated double bond; pentaerythritol tetraacrylate | 1.65 g |
| Photopolymerization initiator; oxime type photopolymerization initiator (CGI-124, manufactured by Ciba Specialty Chemical, Inc.) | 4.95 g |
| Dispersant; commercial solution in which black pigment is dispersed together with a dispersant in a solvent (manufactured by Mikuni Color Co.) EX-2906 | 159 g |
| Solvent; propylene glycol monoethyl ether acetate | 201 g |
| Leveling agent; BYK-330 (manufactured by BYK-Chemie Co.) | 0.003 g |

Each of the ingredients was mixed by the ratio described above to obtain a photosensitive resin composition. Further, the ink repellent agent B was added to the photosensitive resin composition at a ratio of 0.1 wt % to the entire solid weight (entire weight of the photosensitive resin composition excluding the solution weight of the solvent and the dispersant), and stirred to prepare a photosensitive resin composition used for forming the black matrix (partition wall).
(Preparation of Black Matrix (Partition Wall))

Non-alkali glass ("#1737" manufactured by Corning Inc.) was used as a substrate. The photosensitive resin composition was coated on the substrate over the entire surface as a thin film shape of 2.0 μm thickness.

The substrate was pre-baked. Then, exposure was conducted by using a super high pressure mercury lamp at 50 mJ/cm$^2$ using a photomask having a lattice-like pattern. A developing treatment was conducted for 30 sec with an aqueous 10% solution of sodium carbonate to form a partition wall pattern of the resin composition.

The substrate was placed in an oven and put to a thermosetting treatment at 180° C. for 10 min. Table 1 shows the result of measuring the critical surface tension and the contact angle to a coloring ink (surface tension: 30 mN/m) of the partition wall prepared as described above. Since the OD (optical density) value for the partition wall of the color filter prepared in Example 11 was favorable and they have a sufficient light shielding property, it was confirmed that any of them can be used as a light shielding layer. Measurement of the critical surface tension was conducted by measuring the contact angle upon dropping three solutions of different surface tensions and conducting Zisman plot.

The OD value was determined according to the following equation based on the incident light intensity $I_0$ and the transmission light intensity I of a 1 μm specimen.

$$OD = -\log(I/I_0)$$

| (Preparation of coloring ink) | |
|---|---|
| Methacrylic acid | 20 parts by weight |
| Methylmethacrylate | 10 parts by weight |
| Butylmethacrylate | 55 parts by weight |
| Hydroxyethyl methacrylate | 15 parts by weight |
| Butyl lactate | 300 parts by weight | were mixed and reacted at 70° C. for 5 hrs with addition of 0.75 parts by weight of azobis isobutylnitrile in a nitrogen atmosphere to obtain an acryl copolymer resin. The obtained acrylic copolymer resin was diluted with propylene glycol monomethyl ether acetate such that the resin concentration was 10% by weight to obtain a diluted solution of the acryl copolymer resin.

19.0 g of a pigment and 0.9 g of polyoxyethylene alkyl ether as a dispersant were added to 80.1 g of the diluted liquid, and kneaded by three rolls to obtain each of coloring varnishes of red, green and blue. Pigment red 177 was used for the red pigment, pigment green 36 was used for a green pigment, and pigment blue 15 was used for a blue pigment, respectively.

Propylene glycol monomethyl ether acetate was added to each of the obtained coloring varnishes controlled respectively such that the pigment concentration was from 12 to 15% by weight and the viscosity was 15 cps, to obtain coloring inks of red, green, and blue colors.
(Preparation of Color Filter)

Coloring inks were jetted by an inkjet apparatus having a 12 pl, 180 dpi head mounted thereon to the openings of a black matrix disposed on a substrate by using colored inks of red, green, and blue colors to form each of coloring layers of red (R), green (G) and blue (B). Table 3 shows the presence or absence for the occurrence of color-mixing and blanking in the inkjet process of Example 11. In Example 11, it was found that ΔEab (color difference) was favorable and it was a good color filter with less color shading. ΔEab (color difference) was measured by a microanalyzer.

Example 12

Formulation of Photosensitive Resin Composition for Black Matrix

A color filter was manufactured in the same method as in Example 11 except for using an ink repellent agent C instead of the ink repellent agent B by forming partition walls on a substrate, and further forming a coloring layer by an inkjet apparatus. In the same manner as in Example 11, the critical surface tension and the contact angle to the coloring ink (30 mN/m) of the partition wall and the presence or absence of color-mixing and blanking are shown in Table 3.

Example 13

Formulation of Photosensitive Resin Composition for Black Matrix

A color filter was manufactured in the same method as in Example 11 except for using an ink repellent agent D instead of the ink repellent agent B by forming partition walls on a substrate and further forming a coloring layer by an inkjet apparatus. In the same manner as in Example 11, the critical surface tension and the contact angle to the coloring ink (30 mN/m) of the partition wall and the presence or absence of color-mixing and blanking are shown in Table 3.

Example 14

Formulation of Photosensitive Resin Composition for Black Matrix

A color filter was manufactured in the same method as in Example 11 except for using an ink repellent agent E instead of the ink repellent agent B by forming partition walls on a substrate, and further forming a coloring layer by an inkjet apparatus. In the same manner as in Example 11, the critical surface tension and the contact angle to the coloring ink (30 mN/m) of the partition wall and the presence or absence of color-mixing and blanking are shown in Table 3.

Example 15

Formulation of Photosensitive Resin Composition for Black Matrix

A color filter was manufactured in the same method as in Example 11 except for using an ink repellent agent F instead of the ink repellent agent B by forming partition walls on a substrate, and further forming a coloring layer by an inkjet apparatus. In the same manner as in Example 11, the critical surface tension and the contact angle to the coloring ink (30 mN/m) of the partition wall and the presence or absence of color-mixing and blanking are shown in Table 3.

Comparative Example 5

Formulation of Photosensitive Resin Composition for Black Matrix

A color filter was manufactured in the same method as in Example 11 except for using an ink repellent agent A instead of the ink repellent agent B by forming partition walls on a substrate, and further forming a coloring layer by an inkjet apparatus. In the same manner as in Example 11, the critical surface tension and the contact angle to the coloring ink (30 mN/m) of the partition wall and the presence or absence of color-mixing and blanking are shown in Table 3.

Comparative Example 6

Formulation of Photosensitive Resin Composition for Black Matrix

A color filter was manufactured in the same method as in Example 11 except for using an ink repellent agent G instead of the ink repellent agent B by forming partition walls on a substrate, and further forming a coloring layer by an inkjet apparatus. In the same manner as in Example 11, the critical surface tension and the contact angle to the coloring ink (30 mN/m) of the partition wall and the presence or absence of color-mixing and blanking are shown in Table 3.

Example 16

A color filter was manufactured in the same method as in Example 11 except for adding the ink repellent agent B at a ratio of 0.20 wt % instead of adding the ink repellent agent B at a ratio of 0.1 wt % to the entire solid weight (entire weight excluding the solution weight of the solvent and the dispersant) by forming partition walls on a substrate and further, forming a coloring layer by an inkjet apparatus. In the same manner as in Example 11, the critical surface tension and the contact angle to the coloring ink (30 mN/m) of partition wall, and the absence or presence of color-mixing and blanking are shown in Table 4.

Example 17

A color filter was manufactured in the same method as in Example 11 except for adding the ink repellent agent C at a ratio of 0.20 wt % instead of adding the ink repellent agent B at a ratio of 0.1 wt % to the entire solid weight (entire weight excluding the solution weight of the solvent and the dispersant) by forming partition walls on a substrate and, further, forming a coloring layer by an inkjet apparatus. In the same manner as in Example 11, the critical surface tension and the contact angle to the coloring ink (30 mN/m) of the partition wall, and the absence or presence of color-mixing and blanking are shown in Table 4.

Example 18

A color filter was manufactured in the same method as in Example 11 except for adding the ink repellent agent D at a ratio of 0.20 wt % instead of adding the ink repellent agent B at a ratio of 0.1 wt % to the entire solid weight (entire weight excluding the solution weight of the solvent and the dispersant) by forming a partition wall on a substrate and, further, forming a coloring layer by an inkjet apparatus. In the same manner as in Example 11, the critical surface tension and the contact angle to the coloring ink (30 mN/m) of the partition wall, and the absence or presence of color-mixing and blanking are shown in Table 4.

Example 19

A color filter was manufactured in the same method as in Example 11 except for adding the ink repellent agent E at a ratio of 0.20 wt % instead of adding the ink repellent agent B at a ratio of 0.1 wt % to the entire solid weight (entire weight excluding the solution weight of the solvent and the dispersant) by forming a partition wall on a substrate and, further, forming a coloring layer by a inkjet apparatus. In the same manner as in Example 11, the critical surface tension and the contact angle to the coloring ink (30 mN/m) of the partition wall, and the absence or presence of color-mixing and blanking are shown in Table 4.

Example 20

A color filter was manufactured in the same method as in Example 11 except for adding the ink repellent agent F at a ratio of 0.20 wt % instead of adding the ink repellent agent B at a ratio of 0.1 wt % to the entire solid weight (entire weight excluding the solution weight of the solvent and the dispersant) by forming a partition wall on a substrate and, further, forming a coloring layer by a inkjet apparatus. In the same manner as in Example 11, the critical surface tension and the contact angle to the coloring ink (30 mN/m), and the absence or presence of color-mixing and blanking are shown in Table 4.

Comparative Example 7

A color filter was manufactured in the same method as in Example 11 except for adding the ink repellent agent A at a ratio of 0.20 wt % instead of adding the ink repellent agent B at a ratio of 0.1 wt % to the entire solid weight (entire weight excluding the solution weight of the solvent and the dispersant) by forming a partition wall on a substrate and, further, forming a coloring layer by a inkjet apparatus. In the same manner as in Example 11, the critical surface tension and the contact angle to the coloring ink (30 mN/m) of the partition wall, and the absence or presence of color-mixing and blanking are shown in Table 4.

Comparative Example 8

A color filter was manufactured in the same method as in Example 11 except for adding the ink repellent agent G at a ratio of 0.20 wt % instead of adding the ink repellent agent B at a ratio of 0.1 wt % to the entire solid weight (entire weight excluding the solution weight of the solvent and the dispersant) by forming a partition wall on a substrate and, further, forming a coloring layer by a inkjet apparatus. In the same manner as in Example 11, the critical surface tension and the contact angle to the coloring ink (30 mN/m) of the partition wall, and the absence or presence of color-mixing and blanking are shown in Table 4.

TABLE 3

| | | Addition amount of ink repellent agent (0.10 wt %) | | | | |
|---|---|---|---|---|---|---|
| | Ink repellent agent | Ink repellent agent Mn | Critical surface tension | Contact angle | Color mixing occurred | Blanking occurred |
| Comp. Example 5 | Ink repellent agent A | 35000 | 33.4 mN/m | 30° | X | ○ |
| Comp. Example 6 | Ink repellent agent G | 37000 | 31.5 mN/m | 36° | Δ | ○ |
| Example 11 | Ink repellent agent B | 40000 | 29.7 mN/m | 40° | ○ | ○ |
| Example 12 | Ink repellent agent C | 43000 | 29.2 mN/m | 42° | ○ | ○ |
| Example 13 | Ink repellent agent D | 50000 | 28.6 mN/m | 43° | ○ | ○ |
| Example 14 | Ink repellent agent E | 58000 | 28.3 mN/m | 44° | ○ | ○ |
| Example 15 | Ink repellent agent F | 70000 | 28.1 mN/m | 45° | ○ | ○ |

TABLE 4

| | | Addition amount of ink repellent agent (0.20 wt %) | | | | |
|---|---|---|---|---|---|---|
| | Ink repellent agent | Ink repellent agent Mn | Critical surface tension | Contact angle | Color mixing occurred | Blanking occurred |
| Comp. Example 7 | Ink repellent agent A | 35000 | 31.2 mN/m | 37° | Δ | ○ |
| Comp. Example 8 | Ink repellent agent G | 37000 | 30.1 mN/m | 33° | Δ | ○ |
| Example 16 | Ink repellent agent B | 40000 | 28.9 mN/m | 43° | ○ | ○ |
| Example 17 | Ink repellent agent C | 43000 | 28.3 mN/m | 44° | ○ | ○ |
| Example 18 | Ink repellent agent D | 50000 | 27.7 mN/m | 46° | ○ | ○ |

TABLE 4-continued

| | Ink repellent agent | Ink repellent agent Mn | Critical surface tension | Contact angle | Color mixing occurred | Blanking occurred |
|---|---|---|---|---|---|---|
| | Addition amount of ink repellent agent (0.20 wt %) | | | | | |
| Example 19 | Ink repellent agent E | 58000 | 27.3 mN/m | 47° | ○ | ○ |
| Example 20 | Ink repellent agent F | 70000 | 26.9 mN/m | 48° | ○ | ○ |

The disclosure of Japanese Patent Application No. JP2005-209633, filed on Jul. 20, 2005, and the disclosure of Japanese Patent Application No. JP2005-209634, filed on Jul. 20, 2005, are incorporated herein by reference in its entirety.

What is claimed is:

1. A method of manufacturing a printed material comprising:
    providing a substrate, in which
    the substrate includes partition walls for partitioning a surface into a plurality of regions,
    the partition wall includes an ink repellent material containing a resin binder and an ink repellent agent,
    the ink repellent agent is a compound having a site having a compatibility with the resin binder and a site having an ink repellency,
    the critical surface tension of the partition wall is from 24 to 30 mN/m, and
    the number average molecular weight of the ink repellent agent is from 40,000 to 100,000; and
    forming an ink film in the plurality of regions by a printing method.

2. A method of manufacturing a printed material according to claim 1, wherein
    the printing method comprises an inkjet system.

3. A method of manufacturing a printed material according to claim 1, wherein
    the site having the ink repellency is a fluoroalkyl group or perfluoroalkyl group.

4. A method of manufacturing a printed material according to claim 1, wherein
    the site having the compatibility with the resin binder contains a main chain of alkyl groups, alkylene groups, or polyvinyl alcohol groups.

5. A method of manufacturing a printed material according to claim 1, wherein
    the partition wall is a light shielding layer.

6. A method of manufacturing a printed material according to claim 5, wherein
    the partition wall is a light shielding layer containing a black light shielding material.

7. A method of manufacturing a printed material according to claim 1, wherein
    the substrate is a transparent substrate, the ink film is a coloring layer formed of an ink containing a coloring agent, and constitutes a color filter having coloring layers of a plurality of colors.

8. A method of manufacturing a printed material according to claim 1, wherein
    the substrate is a transparent substrate, the ink film is an organic light emitting layer formed of an ink containing an organic light emitting material, and constitutes an organic electroluminescence device having organic light emitting layers of a plurality of colors.

* * * * *